US006554912B2

(12) United States Patent
Sahbari

(10) Patent No.: US 6,554,912 B2
(45) Date of Patent: Apr. 29, 2003

(54) POLYMER REMOVER

(75) Inventor: Javad J. Sahbari, Sunnyvale, CA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/921,052

(22) Filed: Aug. 2, 2001

(65) Prior Publication Data

US 2002/0013239 A1 Jan. 31, 2002

Related U.S. Application Data

(63) Continuation-in-part of application No. 09/576,497, filed on May 23, 2000, now abandoned, which is a continuation-in-part of application No. 09/536,196, filed on Mar. 27, 2000, now abandoned.

(51) Int. Cl.[7] .................................................. B08B 3/04
(52) U.S. Cl. ........................ 134/26; 134/2; 134/22.17; 134/22.19; 134/25.4; 134/36; 134/42; 134/902; 510/175; 510/176; 510/245; 510/254; 510/257; 510/506
(58) Field of Search ........................ 134/2, 22.19, 36, 134/42, 26, 22.17, 25.4, 902; 510/175, 176, 245, 254, 257, 506

(56) References Cited

U.S. PATENT DOCUMENTS

| 3,979,241 A | 9/1976 | Maeda et al. ................ 156/13 |
| 4,230,523 A | 10/1980 | Gajda ......................... 156/657 |
| 5,320,709 A | 6/1994 | Bowden et al. .............. 156/667 |
| 5,571,447 A | 11/1996 | Ward et al. .................. 510/206 |
| 5,792,274 A | 8/1998 | Tanabe et al. ................ 134/1.3 |
| 5,905,063 A | 5/1999 | Tanabe et al. ............... 510/176 |
| 5,972,862 A | 10/1999 | Torii et al. ................... 510/175 |
| 6,068,000 A | 5/2000 | Tanabe et al. ............... 134/1.3 |
| 6,350,560 B1 * | 2/2002 | Sahbari ...................... 430/325 |
| 6,475,966 B1 * | 11/2002 | Sahbari ...................... 510/175 |
| 2002/0013239 A1 * | 1/2002 | Sahbari |

FOREIGN PATENT DOCUMENTS

| EP | 0 827188 | 3/1998 |
| EP | 0 901 160 A | 3/1999 |
| WO | WO 99/60083 | 11/1999 |

* cited by examiner

Primary Examiner—Sharidan Carrillo
(74) Attorney, Agent, or Firm—S. Matthew Cairns

(57) ABSTRACT

Compositions for the removal of polymeric material from a substrate are provided where the compositions include a polyol compound selected from ($C_3$–$C_{20}$)alkanediols, substituted ($C_3$—$C_{20}$)alkanediols, ($C_3$–$C_{20}$)alkanetriols or substituted ($C_3$–$C_{20}$)alkanetriols, a glyco ether, at least 5% wt water based on the total weight of the composition, and a fluoride salt selected from ammonium fluoride, ammonium bifluoride, ammonium-tetramethylammonium bifluoride or mixtures thereof. Methods of removing polymeric material using these compositions are also provided.

14 Claims, No Drawings

POLYMER REMOVER

This application is a continuation-in-part of application Ser. No. 09/576,497, filed on May 23, 2000, now abandoned, which is a continuation-in-part of application Ser. No. 09/536,196, filed Mar. 27, 2000, now abandoned.

BACKGROUND OF THE INVENTION

The present invention relates generally to the field of removal of polymeric materials from a substrate. In particular, the present invention relates to compositions and methods for the removal of plasma induced polymeric material from electronic devices.

Numerous materials containing polymers are used in the manufacture of electronic devices, such as circuits, disk drives, storage media devices and the like. Such polymeric materials are found in photoresists, solder masks, antireflective coatings, and the like. For example, modem technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired residue between patterned features can have deleterious effects on subsequent film depositions processes, such as metallization, or cause undesirable surface states and charges leading to reduced device performance.

The semiconductor industry is moving toward sub-quarter micron geometry features. As the geometry of the features gets smaller and pattern density increases, plasma etching, reactive ion etching, ion milling and the like are required for the lithographic process. During such plasma etching, reactive ion etching and ion milling processes, the polymeric material is subjected to conditions that make the removal of such polymeric material difficult. During the plasma etch process a photoresist film forms a hard to remove organometallic polymeric residue on the sidewalls of the various features being etched. Furthermore, the photoresist is extensively cross-linked due to the high vacuum and high temperature conditions in the etch chamber. Known cleaning processes do not acceptably remove such polymeric residue. For example, acetone or N-methylpyrrolidinone is currently used at extreme conditions, which include high temperature and extended cycle times. Such use conditions are often above the flashpoint of the solvent which raises certain environmental, health and safety issues regarding operator exposure. In addition, productivity and throughput are adversely affected by the extended process cycle times required. Even with such extreme stripping conditions, the devices may have to undergo wet strip followed by de-scum ($O_2$ plasma ash) and a subsequent wet clean for a wet-dry-wet strip process.

U.S. Pat. No. 5,320,709 (Bowden et al.) discloses compositions for the selective removal of organometallic residues remaining after plasma etching of materials having anhydrous ammonium fluoride salt selected from anhydrous ammonium fluoride or anhydrous ammonium bifluoride in a polyhydric alcohol, wherein the composition contains less than 4% by weight added water. The low level of water present in these compositions controls the etch rate and thus makes the compositions selective in the removal of organometallic material without adversely affecting materials such as silicon dioxide. FIG. 3 in this patent clearly shows the dramatic increase in the etch rate of silicon dioxide with increasing water content in the compositions. Such compositions have the drawback of requiring special handling and disposal requirements due to incompatibility with common solvent waste streams, as well as high viscosity which prohibits spray tool processes.

Certain compositions containing a ($C_4$)alkanediol, ammonium bifluoride, dipropylene glycol mono-n-butyl ether, 2 to 3% wt water and 10% wt dimethylacetamide have been used as a glass etchant for flat panel displays. Such compositions have not been used to remove post-plasma etch polymeric residue.

U.S. Pat. No. 5,792,274 (Tanabe et al.) discloses a polymer removing composition containing a) a salt of hydrofluoric acid with a metal free base; b) water soluble organic solvent; and c) water. A long list of possible water soluble organic solvents is provided, however, the only solvent combination disclosed is ethylene glycol plus dimethyl sulfoxide ("DMSO"). No other solvent combinations are taught or suggested in this patent.

In addition, other known stripping compositions for post-plasma etch polymer removal applications have numerous drawbacks including, undesirable flammability, toxicity, volatility, odor, necessity for use at elevated temperatures such as up to 100° C., and high cost due to handling regulated materials. A particular problem with advanced next generation semiconductor devices is that known stripping compositions are incompatible with a variety of thin films in such devices, that is, such known stripping compositions cause corrosion of the thin films, specifically copper, and low-k dielectric material present in such advanced devices.

There is thus a continuing need for strippers and post etch polymer removers that effectively remove polymeric material, are more environmentally compatible, do not damage the features and geometries, do not cause corrosion of the substrate, particularly thin metal films, and do not etch dielectric layers in the substrate.

SUMMARY OF THE INVENTION

It has been surprisingly found that polymeric material may be easily and cleanly removed from substrates, particularly 100% copper substrates with dielectric materials. Such polymeric material may be removed according to the present invention without corrosion of underlying metal layers, specifically copper, and without etching of conventional dielectric materials, such as silicon dioxide and low dielectric constant ("low k") materials, such as hydrogen silsesquioxane, polyarylene ethers, and SILK. It has been further surprisingly found that compositions containing water are effective in removing polymeric material without etching of dielectric materials.

In one aspect, the present invention provides a composition for the removal of polymeric material from a substrate including one or more polyol compounds selected from ($C_3$–$C_{20}$)alkanediols, substituted ($C_3$–$C_{20}$)alkanediols, ($C_3$–$C_{20}$)alkanetriols or substituted ($C_3$–$C_{20}$)alkanetriols, one or more glycol ethers, water, a fluoride salt selected from ammonium fluoride, ammonium bifluoride, ammonium-tetramethylammonium bifluoride or mixtures thereof, wherein the water is present in an amount of at least 5% wt based on the total weight of the composition.

In a second aspect, the present invention provides a method of removing polymeric material from a substrate including the step of contacting a substrate containing polymeric material to be removed with the composition described above.

In a third aspect, the present invention provides a composition for the removal of polymeric material from a substrate including one or more polyol compounds selected from ($C_3$–$C_{20}$)alkanediols, substituted ($C_3$–$C_{20}$)alkanediols, ($C_3$–$C_{20}$)alkanetriols or substituted ($C_3$–$C_{20}$)alkanetriols, one or more glycol ethers, water, a fluoride salt selected from ammonium fluoride, ammonium bifluoride, ammonium-tetramethylammonium bifluoride or mixtures thereof, one or more corrosion inhibitors, wherein the water is present in an amount of at least 5% wt based on the total weight of the composition.

In a fourth aspect, the present invention provides a composition for the removal of polymeric material from a substrate including one or more polyol compounds selected from ($C_3$–$C_{20}$)alkanediols, substituted ($C_3$–$C_{20}$)alkanediols, ($C_3$–$C_{20}$)alkanetriols or substituted ($C_3$–$C_{20}$)alkanetriols, one or more glycol ethers, water, a fluoride salt selected from ammonium fluoride, ammonium bifluoride, ammonium-tetramethylammonium bifluoride or mixtures thereof, one or more surfactants, wherein the water is present in an amount of at least 5% wt based on the total weight of the composition.

In a fifth aspect, the present invention provides a method for removing one or more polymeric materials from an integrated circuit wherein the integrated circuit includes one or more metals and one or more dielectric materials: including the steps of contacting the integrated circuit comprising one or more polymeric materials to be removed with a composition comprising one or more one or more polyol compounds selected from ($C_3$–$C_{20}$)alkanediols, substituted ($C_3$–$C_{20}$)alkanediols, ($C_3$–$C_{20}$)alkanetriols or substituted ($C_3$–$C_{20}$)alkanetriols, one or more glycol ethers, water, a fluoride salt selected from ammonium fluoride, ammonium bifluoride, ammonium-tetramethylammonium bifluoride or mixtures thereof, and rinsing the integrated circuit, wherein the water is present in the composition in an amount of at least 5% wt based on the total weight of the composition.

In a sixth aspect, the present invention provides a method for preparing magnetic thin film heads including the steps of contacting a magnetic thin film head precursor containing one or more polymeric materials to be removed with a composition including one or more polyol compounds selected from ($C_3$–$C_{20}$)alkanediols, substituted ($C_3$–$C_{20}$) alkanediols, ($C_3$–$C_{20}$)alkanetriols or substituted ($C_3$–$C_{20}$) alkanetriols, one or more glycol ethers, water, and a fluoride salt selected from ammonium fluoride, ammonium bifluoride, ammonium-tetramethylammonium bifluoride or mixtures thereof, for a period of time sufficient to remove the polymeric material and rinsing the magnetic thin film head precursor, wherein the water is present in the composition in an amount of at least 5% wt based on the total weight of the composition.

In a seventh aspect, the present invention provides a method for removing polymeric material from a substrate including the steps of: contacting a substrate containing polymeric material to be removed with a composition including one or more polyol compounds selected from ($C_3$–$C_{20}$)alkanediols, substituted ($C_3$–$C_{20}$)alkanediols, ($C_3$–$C_{20}$)alkanetriols or substituted ($C_3$–$C_{20}$)alkanetriols, one or more glycol ethers, water, and a fluoride salt selected from ammonium fluoride, ammonium bifluoride, ammonium-tetramethylammonium bifluoride or mixtures thereof, for a period of time sufficient to remove the polymeric material; and rinsing the substrate, wherein the water is present in the composition in an amount of at least 5% wt based on the total weight of the composition.

DETAILED DESCRIPTION OF THE INVENTION

As used throughout this specification, the following abbreviations shall have the following meanings unless the context clearly indicates otherwise: g=gram; °C=degrees Centigrade; Å=angstrom; % wt=percent by weight; cm=centimeter; mL=milliliter; ppb=parts per billion; UV=ultraviolet; min=minute; PVD=physical vapor deposition; AF=ammonium fluoride; ABF=ammonium bifluoride; DPM=dipropylene glycol monomethyl ether; DPNB= dipropylene glycol mono-n-butyl ether; and MP-diol=2-methyl-1,3-propanediol. All percentages are by weight. All numerical ranges are inclusive and combinable.

The terms "stripping" and "removing" are used interchangeably throughout this specification. Likewise, the terms "stripper" and "remover" are used interchangeably. "Alkyl" refers to linear, branched and cyclic alkyl. The term "substituted alkyl" refers to an alkyl group having one or more of its hydrogens replaced with another substituent group, such as halogen, cyano, nitro, ($C_1$–$C_6$)alkoxy, mercapto, ($C_1$–$C_6$)alkylthio, and the like. As used throughout this specification, the term "aprotic" refers to compounds that do not accept or yield a proton. The term "glycol" refers to dihydric alcohols. Thus, the term "glycol ether" refers to ethers of dihydric alcohols.

The compositions useful in the present invention include one or more polyol compounds selected from ($C_3$–$C_{20}$) alkanediols, substituted ($C_3$–$C_{20}$)alkanediols, ($C_3$–$C_{20}$) alkanetriols or substituted ($C_3$–$C_{20}$)alkanetriols, one or more glycol ethers, water, and a fluoride salt selected from ammonium fluoride, ammonium bifluoride, ammonium-tetramethylammonium bifluoride or mixtures thereof, wherein the water is present in an amount of at least 5% wt.

The polyol compounds useful in the present invention are any which are miscible with water and do not destabilize the composition. By the term "polyol compound" is meant a compound having two or more hydroxyl groups. Suitable polyol compounds include aliphatic polyol compounds such as ($C_3$–$C_{20}$)alkanediols, substituted ($C_3$–$C_{20}$)alkanediols, ($C_3$–$C_{20}$)alkanetriols, substituted ($C_3$–$C_{20}$)alkanetriols, and the like. Suitable aliphatic polyol compounds include, but are not limited to, dihydroxypropanes such as 1,3-propanediol and propylene glycol, diethylene glycol, dipropylene glycol, triethylene glycol, tripropylene glycol, 2-methyl-1,3-propanediol, butanediol, pentanediol, hexanediol, glycerol and the like. It is preferred that the aliphatic polyol compound is 1,3-propanediol, propylene glycol, 2-methyl-propanediol, butanediol or pentanediol. Such polyol compounds are generally commercially available, such as from Aldrich (Milwaukee, Wis.), and may be used without further purification. The polyol compounds are typically used in the present invention in an amount in the range of from about 5 to about 85% wt based on the total weight of the composition, preferably from about 10 to about 70% wt, and more preferably from about 40 to about 70% wt.

The glycol ethers useful in the present invention are any which are water miscible, compatible with the polyol compound and do not destabilize the composition such as glycol mono($C_1$–$C_6$)alkyl ethers and glycol di($C_1$–$C_6$)alkyl ethers, such as but not limited to ($C_1$–$C_{20}$)alkanediol ($C_1$–$C_6$)alkyl ethers and ($C_1$–$C_{20}$)alkanediol di($C_1$–$C_6$)alkyl ethers. Suitable glycol ethers include, but are not limited to, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether, tripropylene glycol monomethyl ether, and the like. It is preferred that the glycol ether is dipropylene glycol monomethyl ether or dipropylene glycol mono-n-butyl ether. Such glycol ethers are generally commercially available and may be used without further purification. Typically, the glycol ethers are present in the compositions of the invention in an amount in the range of from about 5 to about 80% wt based on the total weight of the composition, and preferably from about 10 to about 70% wt. It is preferred that the polyol compound and the glycol ether are present in a weight ratio of 1:1.

While any suitable type of water may be used in the present invention, such as deionized, Milli-Q, distilled, and the like, deionized water is typically used. Any amount of water that is greater than or equal to 5% wt may suitably be used. The practical upper limit of water is about 99% wt. Typically, water is present in an amount in the range of 5 to about 85% wt based on the total weight of the composition, preferably from about 5 to about 50% wt, and more preferably from about 10 to about 45% wt. When the compositions of the present invention are used for the removal of polymeric residue, typically 5 to about 15% wt water is useful, although greater amounts of water may be used. When the compositions of the present invention are used for the removal of post-plasma etch polymeric residue from high aspect ratio openings, for example, vias, typically about 10 to about 45% wt water is useful, although greater amounts of water may be used.

The fluoride salt useful in the present invention is selected from ammonium fluoride, ammonium bifluoride, ammonium-tetramethylammonium bifluoride or mixtures thereof. The fluoride salt is typically present in the compositions of the present invention in an amount of from about 1 to about 5% wt based on the total weight of the composition, and preferably from about 1.5 to about 3% wt. The fluoride salts are generally commercially available and may be used without further purification.

The compositions of the present invention may optionally include one or more additives. Suitable additives include, but are not limited to, corrosion inhibitors, surfactants or wetting agents, co-solvents, chelating agents and the like.

Any corrosion inhibitor which reduces the corrosion of metal film layers is suitable for use in the present invention. Suitable corrosion inhibitors include, but are not limited to, catechol; ($C_1$–$C_6$)alkylcatechol such as methylcatechol, ethylcatechol and tert-butylcatechol; benzotriazole; hydroxyanisole; ($C_1$–$C_{10}$)alkylbenzotriazoles; hydroxy($C_1$–$C_1$)alkylbenzotriazoles; 2-mercaptobenimidazole; gallic acid; gallic acid esters such as methyl gallate and propyl gallate; tetra($C_1$–$C_4$)alkylammonium silicates such as tetramethylammonium silicate, and the like. It is preferred that the corrosion inhibitor is catechol, ($C_1$–$C_6$)alkylcatechol, benzotriazole, ($C_1$–$C_{10}$)alkylbenzotriazoles, 2-mercaptobenimidazole, or tetramethylammonium silicate, and more preferably benzotriazole and tert-butylcatechol. Such corrosion inhibitors are generally commercially available from a variety of sources, such as Aldrich (Milwaukee, Wis.) and may be used without further purification.

When such corrosion inhibitors are used in the compositions of the present invention, they are typically present in an amount in the range of from about 0.01 to about 10% wt, based on the total weight of the composition. It is preferred that the amount of corrosion inhibitor is from about 0.2 to about 5% wt, more preferably about 0.5 to about 3% wt, and most preferably from about 1.5 to about 2.5% wt. It is preferred that a corrosion inhibitor is used.

Nonionic, anionic and cationic surfactants may be used in the compositions of the present invention. Nonionic surfactants are preferred. Such surfactants are generally commercially available. The surfactants are typically present in an amount of from about 0.2 to about 5% wt, preferably from about 0.5 to about 3% wt, and more preferably from about 1 to about 2.5% wt, based on the total weight of the composition. When the compositions of the present invention are used to remove post-plasma etch polymeric residue from high aspect ratio openings, it is preferred that a surfactant is used in the present compositions, and more preferably that a both a surfactant and a corrosion inhibitor are used.

Suitable cosolvents useful in the compositions are any which are water miscible and do not destabilize the present compositions. Such suitable cosolvents include, but are not limited to, polar aprotic solvents such as dimethyl sulfoxide, tetramethylene sulfone (or sulfolane), and dimethyl sufur dioxide; aminoalcohols such as aminoethylaminoethanol; N-($C_1$–$C_{10}$)alkylpyrrolidones such as N-methylpyrrolidone ("NMP"), N-ethylpyrrolidone, N-hydroxyethylpyrrolidone and N-cyclohexylpyrrolidone; amides such as dimethylacetamide ("DMAC") and the like. It is preferred that the cosolvent is selected from N-($C_1$–$C_{10}$)alkylpyrrolidones and amides, more preferably N-methylpyrrolidone, N-ethylpyrrolidone, N-hydroxyethylpyrrolidone, N-cyclohexylpyrrolidone and dimethylacetamide. It is further preferred that the compositions of the present invention are free of amine cosolvent, such as aminoalcohols. When such cosolvents are used they are typically present in an amount in the range of about 5 to about 45% wt, based on the total weight of the composition, preferably about 5 to about 35% wt, and more preferably from about 10 to about 30% wt.

Particularly useful compositions of the present invention are those including from about 1 to about 5% wt, and preferably from about 1.5 to about 2.5% wt of a fluoride salt, and a corrosion inhibitor in an amount of from about 1 to about 3% wt. When one or more cosolvents are used, particularly useful compositions of the present invention are those having a weight ratio of polyol compound/glycol ether/cosolvent of 2:2:1.

The compositions of the present invention may be prepared by combining the one or more polyol compounds, one or more glycol ethers, water, fluoride salt selected from ammonium fluoride, ammonium bifluoride, ammonium-tetramethylammonium bifluoride or mixtures thereof, and optionally one or more additives in any order. Preferably, the fluoride salt is dissolved in the minimum amount of water required for dissolution of the salt and then to the resulting solution is added the one or more polyol compounds, the one or more glycol ethers, sufficient water to provide at least 5% wt, and then the one or more optional additives.

The compositions of the present invention are suitable for removing post-plasma etch polymeric material from a substrate. Any polymeric material, such as, but not limited to, photoresists, soldermasks, antireflective coatings, and the like, that have been subjected to harsh process conditions such as plasma etching, auto-plasma ashing, ion implantation or ion milling processes, can be effectively removed from a substrate according to the present invention. Any polymeric material subjected to the harsh treatment processes described above is referred to as "post-plasma etch polymeric residue" throughout this specification. The compositions and methods of the present invention are particularly useful in removing the organo-metallic polymeric residue present after a dry plasma etching, reactive ion etching and ion milling of materials, such as photoresists, conducting metal layers and insulating dielectric layers.

Polymeric residue on a substrate may be removed by contacting the substrate with a composition of the present invention. The substrate may be contacted with the compositions of the present invention by any known means, such as immersion of the substrate in a bath, such as a wet chemical bench, containing a composition of the present invention such bath being at room temperature or heated, or by spraying a composition of the present invention at a desired temperature on the surface of the substrate. Following contact with the compositions of the present invention, the substrate is typically rinsed such as with deionized water, and then dried such as by spin drying. When the compositions of the present invention are sprayed on a substrate, such spraying operation is typically performed in a spray chamber such as a solvent cleaning spray apparatus available from Semitool, Inc. (Kalispell, Mont.).

An advantage of the present invention is that significantly lower temperatures may be used than those used with known post-plasma etch polymer removers. Typically, the polymeric residue removal process of the present invention may be carried out at ambient temperature, or at any temperature such as from room temperature to about 60° C., preferably from about 20° C. to about 50° C., more preferably from about 25° C. to about 45° C., and most preferably from about 25° C. to about 35° C.

A further advantage of the compositions of the present invention is that they may be effectively used to remove polymeric material from substrates including one or more dielectric layers without substantially etching the dielectric material. Typically, the compositions of the present invention etch dielectric materials at a rate of less than 5 Å/min, preferably at a rate of less than 4 Å/min, and more preferably at a rate of less than 3 Å/min, at 23° C. Thus, the present compositions are compatible with a wide variety of dielectric materials, particularly low dielectric constant ("low-k") materials, such as, but not limited to, siloxanes, silicon dioxides, silsesquioxanes such as hydrogen silsesquioxane, methyl silsesquioxane, phenyl silsesquioxane and mixtures thereof, benzocyclobutenes ("BCB"), polyarylene ethers, polyaromatic hydrocarbons, fluorinated silicon glasses, and the like.

A still further advantage of the compositions of the present invention is that post-plasma etch polymeric material may be removed from a substrate without etching of thermal oxide layers underneath metal lines.

The compositions of the present invention are particularly useful in removing post plasma etch residues when other conventional strippers are not capable of removing such residues. Furthermore the present compositions are substantially non-corrosive to substrates containing metals, particularly copper and aluminum. It is preferred that the compositions of the present invention are non-corrosive to metals, particularly copper and aluminum.

The present compositions are highly effective in the complete removal of the deep-UV photoresist coated on a layer of hard to remove organic, cross-linked polymeric anti-reflective coating ("ARC") polymer. It is very well known that such ARCs are cross-linked polymeric material that are very difficult to remove by conventional photoresist strippers.

In order to achieve sub-half micron geometry metal lines and high aspect ratio via openings, the deep-UV photoresist and the corresponding ARC layer are treated with fluorinated plasma gas, such as that used with high density plasma etchers. The deep-UV positive acting photoresist and the ARC polymer become highly cross-linked under such conditions, leaving behind fluoro-organometallic polymer residues that are very difficult to remove by conventional stripping methods. It has been surprisingly found that the compositions of present invention effectively remove such polymeric residues at ambient temperature and at relatively short processing times.

Thus, the compositions of the present invention are useful in other applications where such harsh or extreme processing conditions occur, such as, but not limited to, flat panel display TFT/LCD manufacture, magneto-resistive and giant magneto-resistive thin film head manufacture, or read-write device manufacture. The compositions of the present invention are substantially inert, and preferably completely inert, to the metal films used in magneto-resistive and giant magneto-resistive thin film head manufacture such as, but not limited to, aluminum oxide ("$Al_2O_3$"), gold ("Au"), cobalt ("Co"), copper ("Cu"), iron ("Fe"), iridium ("Ir"), manganese ("Mn"), molybdenum ("Mo"), nickel ("Ni"), platinum ("Pt"), ruthenium ("Ru"), and zirconium ("Zr"), as well as other metals used in the manufacture of semiconductors and electronic materials, such as, but not limited to, copper, aluminum, nickel-iron, tungsten, titanium, titanium-nitride, tantalum, tantalum nitride.

The following examples are intended to illustrate further various aspects of the present invention, but are not intended to limit the scope of the invention in any aspect.

EXAMPLE 1

This example illustrates the post-plasma etch polymeric residue removal and resist stripping capability of the compositions of the present invention.

A number of silicon wafers (8 inches or 20.3 cm) coated with electroplated copper, or aluminum-titanium-carbide ("AlTiC") ceramic wafers with chemically vapor deposited ("CVD") metal layers or alloy layers of aluminum ("Al"), aluminum oxide("$Al_2O_3$"), silicon ("Si"), copper ("Cu"), titanium ("Ti"), titanium nitride ("TiN"), or tungsten ("W"), were coated with either AZ 4000 series positive photoresist (available from Clariant Corp., Somerville, N.J.) or DUV positive photoresist (available from Shipley Company, Marlborough, Mass.) as well as an antireflective coating polymer (available from Shipley Company). The wafers were then hard baked, processed and autoplasma ashed. After ashing, the wafers were then immersed in a 500 mL bath of a stripping composition at 25° C. for 15 to 20 minutes. The wafers then were rinsed with deionized ("DI") water and nitrogen blow dried. After drying, the wafers were tested for polymer residues and possible metal corrosion using a field emission scanning electron microscope ("FE-SEM") using standard methodology. The stripping compositions tested are reported in Table 1.

TABLE 1

| Sample | Composition |
|---|---|
| A | 60% MP-diol/35% DPM/2% ABF/2.5% water/0.5% benzotriazole |
| B | 50% MP-diol/25% DPNB/20% DMAC/2% ABF/2% water/0.5% benzotriazole |
| C | 75% propylene glycol/20% DPM/2% AF/2.5% water/0.5% benzotriazole |
| D | 60% MP-diol/35% DPM/2% ABF/2.5% water/0.5% tert-butylcatechol |
| E | 50% MP-diol/25% DPNB/20% DMAC/2% ABF/2% water/0.5% tert-butylcatechol |
| F | 75% propylene glycol/20% DPM/2% AF/2.5% water/0.5% tert-butylcatechol |

The stripping and corrosion results are reported in Table 2. The thin films tested and reported in Table 2 were either individual metal layers or alloy layers. The layers, whether individual metal layers or alloy layers, are separated by commas. Alloys are denoted by the symbol "/", such as Al/Cu.

TABLE 2

| Sample | Thin Film Compositions Tested | Polymer Residue | Thin Film Corrosion |
|---|---|---|---|
| A | 100% Cu | Clean, no polymer residue | No Cu corrosion |
| B | $Al_2O_3$, Al/Cu, Si, Ti/TiN | Clean, no polymer residue | No Al, Cu or Ti corrosion |
| C | $Al_2O_3$, Al/Cu, Si, W, Ti, TiN | Clean, no polymer residue | No W, Al, Cu or Ti corrosion |
| D | $Al_2O_3$, Al, Cu, W, Ti, TiN | Clean, no polymer residue | Slight W and Cu corrosion |
| E | $Al_2O_3$, Al, Cu, W, Ti, TiN | Clean, no polymer residue | Slight W and Cu corrosion |
| F | $Al_2O_3$, Al, Cu, W, Ti, TiN | Clean, no polymer residue | Slight W and Cu corrosion |

The above data clearly show that the compositions of the present invention are effective in removing post-plasma etch polymeric residue wand are substantially non-corrosive to metal layers.

EXAMPLE 2

This example illustrates the non-corrosive nature of the compositions of the present invention to copper.

Silicon wafers containing an electroplated 100% copper layer were cut into 2 in.×2 in. (5 cm×5 cm) chips and heated in 100 mL of a stripper bath at 75° C. for 30 minutes, The copper plated wafers were then removed from the stripper bath. The stripper bath was then examined for dissolved copper content using an HP-4500 inductively coupled plasma mass spectrometer ("ICP-MS"), available from Hewlett-Packard, using a cold shield plasma method. Two stripper baths of the present invention, Samples G and H, were compared with three known polymer stripper baths, comparative samples C1–C3. The compositions of the stripper baths and the amount of dissolved copper are reported in Table 3.

TABLE 3

| Sample | Composition | Dissolved Copper (ppb) |
|---|---|---|
| G | 40% MP-diol/25% DPM/25% water/3% ABF/2% benzotriazole | 110 |
| H | 50% MP-diol/25% DPNB/20% water/3% ABF/2% benzotriaole | <100 |
| C1 | 25% hydroxylamine/62.5% diglycolamine/12.5% water/5% catechol | 7865 |
| C2 | 60% monoethanolamine/25% hydroxylamine/10% water/5% catechol | 8640 |
| C3 | N-methylpyrrolidone/ethanolamine | 11060 |

The above data clearly show that the compositions of the present invention are significantly less corrosive to copper than known stripping compositions.

EXAMPLE 3

The procedure of Example 2 was repeated using flat panel displays ("FPDs") having a glass panel coated with different metal alloys. No significant corrosion was seen in any of the metal layers.

EXAMPLE 4

The procedure of Example 2 was repeated using a glass substrate having an indium tin oxide/tantalum ("ITO/Ta") thin film. No significant corrosion was seen on the metal layers.

EXAMPLE 5

The procedure of Example 2 was repeated using a niobium/aluminum/niobium ("Nb/Al/Nb") substrate. No significant corrosion of the metal layers was found.

EXAMPLE 6

The procedure of Example 2 was repeated using magnetoresistive and giant magnetoresistive thin film heads containing $Al_2O_3$ thin films. No significant corrosion was found on the $Al_2O_3$ thin films, however trace amounts of aluminum were detected in the stripping baths.

EXAMPLE 7

A silicon wafer containing a metal layer of TiN/AlCu/TiN on a thermal oxide layer was broken into several small pieces. A stripping bath containing 27.5% DPM, 27.5% water, 27.5% MP-diol, 13.8% DMAC, 1.8% ammonium fluoride, 0.9% nonionic surfactant and 0.9% corrosion inhibitor was prepared. The stripping bath was heated at various temperatures. A piece of the water was placaed in a stripping bath for 10 minutes at each of the temperatures tested. After 10 minutes, the wafer pieces were removed from the bath, rinsed with deionized water for 5 minutes and then dried under a clean nitrogen stream. All samples were evaluated by FE-SEM to determine the amount of oxide layer undercut. The results are reported in Table 4.

TABLE 4

| Temperature (° C.) | Oxide Undercut | Etch Rate (Å/min) |
|---|---|---|
| 23 | None | 2 |
| 30 | None | 3 |
| 35 | None | 3.5 |
| 40 | None | 5 |

TABLE 4-continued

| Temperature (° C.) | Oxide Undercut | Etch Rate (Å/min) |
|---|---|---|
| 45 | Beginning of undercut | 10 |
| 50 | Some undercut | 20 |
| 55 | Undercut | 35 |

The above data clearly show that the compositions of the present invention are useful over a range of temperatures without undercutting of the oxide layer.

EXAMPLE 8

This example illustrates that the compositions of the present invention are compatible with dielectric material.

A number of samples of dielectric material were subjected to a stripping bath containing 27.5% DPM, 27.5% water, 27.5% MP-diol, 13.8% DMAC, 1.8% ammonium fluoride, 0.9% nonionic surfactant and 0.9% corrosion inhibitor and heated to 23° C. The etch rates of the bath on the various dielectric materials were determined and the results are reported in Table 5.

TABLE 5

| Dielectric Material | Etch Rate (Å/min) |
|---|---|
| Siloxane | <2 |
| Hydrogen silsesquioxane | <3 |
| Methyl silsesquioxane | <1 |
| Benzocyclobutene | <1 |
| Polyaromatic hydrocarbon | <2 |
| Poly(arylene ether) | <2 |
| Hybrid organic siloxane | 243 |
| Fluorinated silicon glass | <2 |

It can be seen from the above data that the compositions of the present invention are generally non-corrosive to dielectric materials, particularly inorganic materials such as silicon glasses.

EXAMPLE 9

The procedure of Example 8 was repeated except that various oxide materials were subjected to the stripping bath. These data are reported in Table 6. "BPSG" refers to boron phosphorus silicon glass, "TEOS" refers to tetraethyl orthosilicate and "PE-SiO2" refers to plasma enhanced silicon oxide.

TABLE 6

| Oxide Material | Etch Rate (Å/min) |
|---|---|
| Thermal oxide | <1 |
| Densified BPSG | 2 |
| TEOS | <1 |
| PE-SiO$_2$ | <1 |

The above data clearly show that the compositions of the present invention do not substantially etch oxide materials.

EXAMPLE 10

The procedure of Example 8 was repeated except that various metals were subjected to the stripping bath. The results are reported in Table 7.

TABLE 7

| Metal | Etch Rate (Å/min) |
|---|---|
| Electroplated copper | <1 |
| PVD deposited copper | <3 |
| Aluminum-silicon | <1 |
| Titanium | <1 |
| Titanium Nitride | <1 |
| Tungsten | <1 |
| Tantalum | <1 |
| Tantalum Nitride | <1 |

These data clearly show that the compositions of the present invention are substantially non-corrosive to metals.

EXAMPLE 11

Silicon oxide layers contacted with compositions of the invention containing ABF as the fluoride salt and >5% water showed mottling but no significant loss of silicon dioxide. Similar compositions containing <5% water showed no mottling. Such mottling is only a cosmetic defect and is not a significant loss of silicon dioxide. Silicon oxide layers contacted with compositions of the invention containing AF as the fluoride salt and water contents of from about 5% to about 35% showed no mottling and no significant loss of silicon dioxide.

Upon heating the compositions of the invention to about 40° C., the amount of silicon dioxide etch was accelerated. At temperatures below about 35° C. no significant silicon dioxide etch was seen using AF or ABF as the fluoride salt.

These data clearly demonstrate that the compositions of the present invention do not substantially etch silicon dioxide.

EXAMPLE 12

The procedure of Example 2 was repeated except that various corrosion inhibitors were evaluated in the following stripper composition: 28% DPM, 28% water, 28% MP-diol, 14% DMAC, and 2% ammonium fluoride. The corrosion inhibitors were evaluated for copper corrosion by visual inspection and rated on a scale of 1 to 10, 1 being the most corrosive and 10 being the least corrosive composition to the copper. The results are reported in Table 8.

TABLE 8

| Sample | Corrosion Inhibitor | Amount (% wt) | Rating |
|---|---|---|---|
| I | catechol | 3–5 | 7 |
| J | Tert-butylcatechol | 3–5 | 8 |
| K | Benzotriazole | 2–4 | 10 |
| L | Benzotriazole derivative | 2–4 | 9 |
| M | Tetramethylammonium silicate | 0.1–1 | 9 |
| N | 2-mercaptobenzoimidazole | 2–4 | 9 |

The above data show that all the corrosion inhibitors are effective in the compositions of the present invention.

EXAMPLE 13

This example illustrates the cleaning process of a flat panel display ("FPD" or "TFT/LCD").

Liquid crystal display flat display panels having as metal stacks copper ("Cu"), molybdenum ("Mo"), tungsten ("W") and titanium-nitride ("Ti—N") and containing a positive photoresist layer were treated with high density plasma to etch metal layers and were ashed by oxygen plasma. The resulting plasma etched polymer residue was tested using two commercially available photoresist strippers and polymer removers (Comparatives C4 and C5) and two compositions of the present invention. The compositions tested are reported in Table 9.

TABLE 9

| Sample | Composition |
| --- | --- |
| C4 (Comparative) | 30% hydroxylamine/65% diglycolamine/5% catechol |
| C5 (Comparative) | 30% hydroxylamine/65% monoethanolamine/5% catechol |
| O | 32% MP-diol/32% DPM/32% water/2% AF/2% benzotriazole |
| P | 27.5% DPM/27.5% water/27.5% MP-diol/13.8% DMAC/1.8% AF/0.9% nonionic surfactant/0.9% benzotriazole |

The stripping times and temperatures used were the manufacturers' recommended times and temperatures and are reported in Table 10. The samples were evaluated for the extent of polymer residue removal capability of each composition by a JEOL-6320 SEM (scanning electron microscope) as well as by measurements of resistivity/conductivity of contact via openings. The samples were also evaluated for any corrosion of the metal layers. The amount of corrosion of each metal substrate was measured using the concentration of ionic species in the stripping solutions before and after stripping process. The ionic concentrations were measured by a Hewlett-Packard HP-4500 inductively coupled plasma emission mass spectrometer ("ICP/MS") using cold plasma techniques and utilizing standard addition methods. The extent of metal corrosion and polymer residue removal results are reported in Table 10.

TABLE 10

| Sample | Temperature (° C.) | Time (min) | Residue Removal (%) | Corrosion |
| --- | --- | --- | --- | --- |
| C4 | 75 | 60 | 70–80 | Cu, Mo, Ti-N, W |
| C5 | 75 | 60 | 80–90 | Cu, Mo, Ti-N, W |
| O | 25 | 20 | 100 | None |
| P | 22 | 15 | 100 | None |

The above data clearly show that the compositions of the invention are very effective at quickly and completely removing plasma etching polymeric residue without causing corrosion of the substrate.

What is claimed is:

1. A method for removing one or more polymeric materials from an integrated circuit wherein the integrated circuit comprises one or more metals and one or more dielectric materials: comprising the steps of contacting the integrated circuit comprising one or more polymeric materials to be removed with a composition comprising one or more polyol compounds selected from the group consisting of $(C_3-C_{20})$ alkanediols, substituted $(C_3-C_{20})$ alkanediols, $(C_3-C_{20})$ alkanetriols and substituted $(C_3-C_{20})$ alkanetriols, one or more glycol ethers, water, and a fluoride salt mixture comprising ammonium fluoride and ammonium bifluoride for a period of time sufficient to remove the polymeric material and rinsing the integrated circuit, wherein the water is present in the composition in an amount of at least 5% wt based on the total weight of the composition.

2. A method for removing polymeric material from magnetic thin film heads comprising the steps of contacting a magnetic thin film head containing one or more polymeric materials to be removed with a composition comprising one or more polyol compounds selected from the group consisting of $(C_3-C_{20})$ alkanediols, substituted $(C_3-C_{20})$ alkanediols, $(C_3-C_{20})$ alkanetriols and substituted $(C_3-C_{20})$ alkanetriols, one or more glycol ethers, water, and a fluoride salt mixture comprising ammonium fluoride and ammonium bifluoride for a period of time sufficient to remove the polymeric material and rinsing the magnetic thin film head, wherein the water is present in the composition in an amount of at least 5% wt based on the total weight of the composition.

3. A method for removing polymeric material from a substrate comprising the steps of: contacting a substrate containing polymeric material to be removed with a composition comprising one or more polyol compounds selected from the group consisting of $(C_3-C_{20})$ alkanediols, substituted $(C_3-C_{20})$ alkanediols, $(C_3-C_{20})$ alkanetriols and substituted $(C_3-C_{20})$ alkanetriols, one or more glycol ethers, water, and a fluoride salt mixture comprising ammonium fluoride and ammonium bifluoride for a period of time sufficient to remove the polymeric material; and rinsing the substrate, wherein the water is present in the composition in an amount of at least 5% wt based on the total weight of the composition.

4. The method of claim 3 wherein one or more polyol compounds are $(C_3-C_{20})$ alkanediols or $(C_3-C_{20})$ alkanetriols selected from the group consisting of 1,3-propanediol, propylene glycol, diethylene glycol, dipropylene glycol, triethylene glycol, tripropylene glycol, 2-methyl-1,3-propanediol, butanediol, pentanediol, hexanediol, and glycerol.

5. The method of claim 3 wherein the one or more polyol compounds are present in an amount of from about 5 to about 85% wt based on the total weight of the composition.

6. The method of claim 3 wherein the one or more glycol ethers are selected from the group consisting of $(C_1-C_{20})$ alkanediol $(C_1-C_6)$ alkyl ethers and $(C_1-C_{20})$ alkanediol di$(C_1-C_6)$ alkyl ethers.

7. The method of claim 3 wherein the one or more glycol ethers are selected from the group consisting of ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether and tripropylene glycol monomethyl ether.

8. The method of claim 3 wherein the one or more glycol ethers are present in an amount of from about 5 to about 80% wt, based on the total weight of the composition.

9. The method of claim 3 wherein the ammonium fluoride or the ammonium bifluoride is present in an amount of from about 1 to about 5% wt, based on the total weight of the composition.

10. The method of claim 3 wherein the composition further comprises one or more of additives selected from corrosion inhibitors, surfactants, co-solvents or chelating agents.

11. The method of claim 10 wherein the corrosion inhibitor is selected from the group consisting of catechol, $(C_1-C_6)$ alkylcatechol, benzotriazole, hydroxyanisole, $(C_1-C_{10})$ alkylbenzotriazoles, $(C_1-C_{10})$ hydroxyalkylbenzotriazoles; 2-mercaptobenimidazole, gallic acid, gallic acid esters, and tetra$(C_1-C_4)$ alkylammonium silicates.

12. The method of claim 10 wherein the co-solvent is selected from the group consisting of polar aprotic solvents, aminoalcohols, N-$(C_1-C_{10})$ alkylpyrrolidones, and amides.

13. A method for removing polymeric material from a substrate comprising the steps of: contacting a substrate containing polymeric material to be removed with a composition consisting essentially of one or more polyol compounds selected from the group consisting of $(C_3-C_{20})$ alkanediols, substituted $(C_3-C_{20})$alkanediols, $(C_3-C_{20})$ alkanetriols and substituted $(C_3-C_{20})$alkanetriols, one or more glycol ethers, water, a fluoride salt mixture comprising ammonium fluoride and ammonium bifluoride and optionally one or more additives selected from the group consisting of corrosion inhibitors, surfactants and co-solvents, for a period of time sufficient to remove the polymeric material; and rinsing the substrate, wherein the water is present in the composition in an amount of at least 5% wt based on the total weight of the composition.

14. The method of claim 13 wherein the co-solvent is selected from the group consisting of dimethyl sulfoxide, tetramethylene sulfone, dimethyl sulfur dioxide, aminoethylaminoethanol, N-methylpyrrolidone, N-ethylpyrrolidone, N-hydroxyethylpyrrolidone, N-cyclohexylpyrrolidone, and dimethylacetamide.

* * * * *